United States Patent
Hu et al.

(10) Patent No.: US 6,583,017 B2
(45) Date of Patent: Jun. 24, 2003

(54) SELF ALIGNED CHANNEL IMPLANT, ELEVATED S/D PROCESS BY GATE ELECTRODE DAMASCENE

(75) Inventors: Chu-Wei Hu, Taichung (TW); Jiue-Wen Weng, Hsin-Chu (TW); Chung-Te Lin, Tainan (TW); So-Wein Kuo, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/927,072

(22) Filed: Aug. 10, 2001

(65) Prior Publication Data

US 2002/0182814 A1 Dec. 5, 2002

Related U.S. Application Data

(62) Division of application No. 09/253,297, filed on Feb. 19, 1999, now Pat. No. 6,287,926.

(51) Int. Cl.[7] .............................................. H01L 21/336
(52) U.S. Cl. .................. 438/306; 438/289; 438/305; 438/302; 438/589; 438/592
(58) Field of Search ................. 438/306, 305, 438/303, 289, 291, 589, 302, 592

(56) References Cited

U.S. PATENT DOCUMENTS

| | | | | |
|---|---|---|---|---|
| 5,073,512 A | * | 12/1991 | Yoshino | 438/291 |
| 5,376,578 A | | 12/1994 | Hsu et al. | 437/56 |
| 5,434,093 A | | 7/1995 | Chau et al. | 437/41 |
| 5,527,725 A | * | 6/1996 | Park | 438/301 |
| 5,538,913 A | | 7/1996 | Hong | 437/44 |
| 5,571,738 A | * | 11/1996 | Krivokapic | 438/291 |
| 5,750,430 A | * | 5/1998 | Son | 438/291 |
| 5,773,348 A | * | 6/1998 | Wu | 438/305 |
| 5,786,256 A | | 7/1998 | Gardner et al. | 438/305 |
| 5,801,075 A | | 9/1998 | Gardner et al. | 438/197 |
| 5,856,226 A | * | 1/1999 | Wu | 438/291 |
| 6,087,706 A | * | 7/2000 | Dawson et al. | 257/520 |

* cited by examiner

*Primary Examiner*—Michael Trinh
(74) *Attorney, Agent, or Firm*—George O. Saile; Stephen B. Ackerman

(57) ABSTRACT

A method for creating a self-aligned channel implant with elevated source/drain areas. Forming a thin dielectric layer on top of a silicon substrate, a thick layer of oxide is deposited over this dielectric. An opening is exposed and etched through the layer of oxide, through the dielectric and into the underlying silicon substrate creating a shallow trench in the substrate. By performing the channel implant LDD implant, pocket implant, forming the gate spacers and electrode, removing the thick layer of oxide and forming the S/D regions a gate electrode has been created with elevated S/D regions. By forming the gate spacers, performing channel implant, forming the gate electrode, removing the thick layer of oxide and performing S/D implant a gate electrode has been created with elevated S/D regions and disposable spacers. By forming the gate spacers and the gate electrode, removing the thick layer of oxide and performing S/D implant a gate electrode has been created with elevated S/D regions and spacers where the gate poly protrudes above the spacers thus enhancing the formation of silicide.

9 Claims, 5 Drawing Sheets

SELF ALIGNED CHANNEL IMPLANT, ELEVATED S/D PROCESS BY GATE ELECTRODE DAMASCENE

This is a division of patent application Ser. No. 09/253,297, filing date Feb. 19, 1999, U.S. Pat. No. 6,287,926, A Novel Self-Aligned Channel Implant, Elevated S/D Process By Gate Electrode, assigned to the same assignee as the present invention.

BACKGROUND OF THE INVENTION (1) Field of the Invention

The invention belongs to the field of semiconductor manufacturing, and more specifically to a method for the implantation of a self-aligned channel and elevated source/drain areas in the damascene process.

(2) Description of the Prior Art

Self-alignment is a technique in which multiple regions on the wafer are formed using a single mask, thereby eliminating the alignment tolerances that are required by additional masks. As circuit sizes decrease, this approach finds more application. One of the areas where the technique of self-alignment was used at a very early stage was the self-aligned source and gate implant to the poly gate.

The present invention relates to the Damascene process that is used for the formation of semiconductor devices. Damascene derives its name from the ancient art involving inlaying metal in ceramic or wood for decorative purposes. In Very Large-Scale Integrated circuit applications, the Damascene process refers to a similar structure.

The Damascene process has been demonstrated on a number of applications. The most commonly applied process is first metal or local interconnects. Some early Damascene structures have been achieved using Reactive Ion Etching (RIE) but Chemical Mechanical Planarization (CMP) is used exclusively today. Metal interconnects using Damascene of copper and Of aluminum is also being explored.

As transistor dimensions have decreased, the conventional contact structures used began to limit device performance. It was, for instance, not possible to minimize the contact resistance if the contact hole was also of minimum size while problems with cleaning small contact holes also became a concern. In addition, the area of the source/drain regions could not be minimized because the contact hole had been aligned to this region using a separate masking step whereby extra area had to be allocated to accommodate misalignment. It was also practice to use several, small contact holes of identical size meaning that the full width of the source/drain region was not available for the contact structure. This resulted in the source/drain resistance being proportionally larger than it would have been in a device having minimum width.

One of the alternate structures that have been employed in an effort to alleviate this problem is the formation of self-aligned silicides on the source/drain regions. Where these silicides are formed at the same time as the polycide structure, this approach is referred to as a salicide process. The entire source/drain region (of, for instance, a CMOS device) is contacted with a conductor film. This approach becomes even more attractive where such a film can be formed using a self-aligned process that does not entail any masking steps.

Although CMOS is now a dominant integrated circuit technology, it was in its initial phases considered to be only a runner up for the design of MOS IC's. The CMOS design is based on the paring of complementary n- and p-channel transistors to form low-power IC's. CMOS technology has, over the years, developed to the point where it now offers advantages of significantly reduced power density and dissipation, as well as in device/chip performance, reliability, circuit design and fabrication cost.

In advanced CMOS processes, the gate length are short enough that Lightly Doped Drain (LDD) structures must be used to minimize hot-electron effect, especially if the devices are NMOS devices. A removable spacer LDD process has been explored that does not required the use of any masks other than the two needed to selectively form the sources and drains of the two transistor types.

Various techniques have been developed for forming the shallow source/drain junctions that are needed for sub-micron CMOS devices. One such approach uses As for the n-channel devices while $BF_2^+$ is used for the p-channel devices. Another approach applies the formation of $COSi_2$ (before the formation of the source and the drain regions) by means of heavy ion implantation. Yet another approach uses the creation of so-called elevated source-drains. A thin (for instance 200 um.) epitaxial layer of silicon can be selectively deposited onto the exposed source/drain areas of the MOS transistor, this following the implantation of the lightly doped region of the LDD structure and the formation of the spacers. This process leads to the formation of heavily doped, shallow source/drain regions. The source/drain junction depth is this case are less than 0.2 um. The gate oxide that covers the source/drain regions is usually etched away and re-grown following the implant step required to for the elevated regions.

The method by which components of an integrated circuit are interconnected involves the fabrication of metal strips that runs across the oxide in the regions between the transistors, the field regions. However, these metal strips form the gates of parasitic MOS transistors, with the oxide beneath them forming a gate oxide and the diffused regions acting as the source and drain regions. The threshhold voltage of these parasitic transistors must be kept higher than any possible operating voltage so that spurious channels will not be inadvertently formed between devices. Several methods have been used to raise the threshold voltage. These methods involve increasing the field oxide thickness or raising the doping beneath the field oxide. The large oxide step however presents problems of step coverage so that reduced oxide thickness is preferred. The doping under the field oxide must therefore be increased. Emphasis is nevertheless still placed on making the field oxide seven to ten times thicker than the gate oxide, this heavy layer of oxide also reduces the parasitic capacitance between the interconnect runner and the substrate. Normally, ion implantation is used to increase the doping under the field oxide. This step is called the channel step implant. The combination of channel-step-implant with the thick oxide can provide adequate isolation for oxide isolated bipolar IC's.

In the deep sub-quarter micron CMOS process, Prior Art uses a (super) steep channel profile in order to maintain good current drive and high immunity against leakage current and voltage penetration. This approach however increases the CR delay time due to the incurred high source to drain capacitance. The increase of the CR delay time can be avoided if the implant is located directly below the transistor gate. The challenge when combining salicide technology with source/drain implantation is to achieve a shallow junction for the sub-quarter micron CMOS process. Elevated source/drain regions maintain good resistivity characteristics for the salicide process while at the same time providing shallow source/drain junctions. The critical step in applying gate photolithography typically is the step of exposing the source/drain gate, within the process of the present invention the required tolerances for this processing step can be relaxed since the size of the source/drain gate electrode has been increased.

U.S. Pat. No. 5,434,093 (Chau et al.) shows a self-aligned channel implant, elevated s/d process by gate electrode damascene. However, this patent differs from the invention in the exact order of the LDD I/I. This patent is very close-to the invention.

U.S. Pat. No. 5,538,913 (Hong) Process for fabricating MOS transistors having full-overlap lightly doped drain structure—shows self-aligned channel implant, (not elevated) s/d process by gate electrode damascene. This patent does not show the invention's trench into the substrate. This patent is extremely close to the invention.

U.S. Pat. No. 5,801,075 shows a self aligned channel implant, elevated s/d process by gate electrode damascene. However, this patent differs from the invention by not showing an angled LDD I/I.

U.S. Pat. No. 5,376,578(Hsu et al.) teaches a FET with raised diffusions. However, this reference differs from the invention.

U.S. Pat. No. 5,786,256(Gardner et al.) recites a damascene gate electrode process. However, this reference differs from the invention in the exact 1/1 steps.

SUMMARY OF THE INVENTION

It is an objective of the present invention to create elevated source/drain regions by etching into the underlying substrate thereby maintaining good resistivity characteristics for the salicide process while at the same time providing shallow source/drain regions.

It is another objective of the invention to provide a gate electrode structure with disposable spacers thereby facilitating the implanting of the Lightly Doped Drain (LDD) and Source/Drain (S/D) regions.

It is another objective of the invention to provide a gate electrode structure wherein the gate polysilicon is above the gate spacers thereby facilitating the process of surface silicidation.

It is another objective of the invention is to provide a method to create a deep channel implantation for CMOS devices to improve device speed and without mask alignment problems.

It is another objective of the present invention to provide a method to create a deep channel implantation for CMOS devices while maintaining good device electrical insulation characteristics.

It is another objective of the present invention to provide a method to create a deep channel implantation for CMOS devices without increasing device CR delay time.

It is another objective of the present invention to provide a method to create a deep channel implantation for CMOS devices wherein the implantation is located directly beneath the device gate electrode.

It is another objective of the present invention to provide a method to create a deep channel implantation for CMOS devices while maintaining shallow junction depth on the top surface of the source/drain regions.

It is another objective of the present invention to provide a method to create a deep channel implantation for CMOS devices while maintaining low sheet resistance in the silicon substrate.

It is another objective of the present invention to provide a method to create a deep channel implantation for CMOS devices thereby making alignment tolerances for the photo lithographic exposing and etching of the device gates less critical.

It is another objective of the present invention to provide a method to create a deep channel implantation for CMQS devices for the salicide process.

Under the first embodiment of the present invention, the present invention teaches forming a thin dielectric layer on top of the silicon substrate; a thick layer of oxide is deposited over this dielectric. An opening is exposed and etched through the layer of oxide, through the thin dielectric layer and into the underlying silicon substrate. The trench that is formed in this way in the substrate is shallow, a thin oxide layer is formed on the bottom of this shallow trench in the substrate followed by the channel implant, LDD formation and a pocket implant. Spacers are formed on the sidewalls of the trench, the thin layer of oxide at the bottom of the trench is removed and replaced with a gate dielectric. The trench is filled and planarized to form the gate electrode. The thick layer of oxide surrounding the trench together with the thin dielectric layer on the surface of the silicon substrate are removed followed by the final step of implanting the source and drain regions.

Under the second embodiment of the present invention, the present invention teaches forming a thin dielectric layer on top of the silicon substrate; a thick layer of oxide is deposited over this dielectric. An opening is exposed and etched through the layer of oxide, through the thin dielectric layer and into the underlying silicon substrate. The trench that is formed in this way in the substrate is shallow, a thin oxide layer is formed on the bottom of this shallow trench in the substrate followed by the formation of the spacers on the sidewalls of the trench after which the channel implant is performed. The thin layer of oxide on the bottom of the trench is removed and replaced with a gate dielectric, the gate electrode is formed. The heavy layer of oxide and the thin dielectric layer on the surface of the silicon substrate are removed; the source and drain regions are implanted. Silicide is formed on top of the source and drain regions and on the top surface of the gate electrode. The spacers are removed from the gate electrode followed by the implantation of the LDD in the surface of the substrate where the spacers previously contacted this surface.

Under the third embodiment of the present invention, the present invention teaches forming a thin dielectric layer on top of the silicon substrate; a thick layer of oxide is deposited over this dielectric. An opening is exposed and etched through the layer of oxide, through the thin dielectric layer and into the underlying silicon substrate. The trench that is formed in this way in the substrate can be deeper that the trench formed under the first and second embodiment of the invention, a thin oxide layer is formed on the bottom of this trench in the substrate followed by the channel implant. The third embodiment differs from the first embodiment in that no LDD and pocket implant occurs at this time. Spacers are formed on the sidewalls of the trench, the thin layer of oxide is removed from the bottom of the trench, the gate dielectric is formed at the bottom of the trench followed by the formation of the gate electrode. The spacer formed on the sidewall of the trench is overetched so that the top surface of the spacer is lower than the top surface of the gate electrode. This enhances the formation of silicide later in the process. The S/D implant is performed, since the trench that has been etched into the surface of the silicon substrate is relatively deep, most of the S/D area is above the gate dielectric. Lateral diffusion of the implant will cause the implant to also reach the regions under the gate electrode spacers, this lateral diffusion takes the place of previous LDD implant. The formation of silicide will take place on the top surface of the gate electrode and the regions of the surface of the silicon substrate above the S/D regions.

The structures obtained under the three embodiments of the present invention are not identical. These structures however meet the objectives of the present invention as highlighted above.

BRIEF DESCRIPTION OF THE DRAWINGS

The above sequence of FIGS. 1 through 5 presents the first embodiment of the present invention.

FIGS. 1 and 2 remain, for the second embodiment of the invention, as shown above under the first embodiment of the invention and apply to the second embodiment of the invention.

FIG. 6 shows a cross-section after the formation of the layer of oxide at the bottom of the trench, the formation of spacers and the formation of the gate dielectric at the bottom of the trench and during the implantation of the channel under the second embodiment of the invention.

FIG. 7 shows a cross-section after the removal of the layer of oxide from the bottom of the trench, the formation of the gate dielectric and the formation of the gate electrode under the second embodiment of the invention.

FIG. 8 shows a cross-section after the removal of the heavy layer of oxide and the thin dielectric layer from the surface of the substrate and during the S/D implant under the second embodiment of the invention.

FIG. 9 shows a cross section after the silicide has been formed on top of the S/D regions, the spacer has been removed and during the formation of the LDD regions under the second embodiment of the invention.

FIGS. 10 through 13 show the third embodiment of the present invention.

FIGS. 1 and 2 remain as shown above under the first and second embodiment of the present invention and apply to the third embodiment of the invention.

FIG. 10 shows a cross-section after the formation of the layer of oxide at the bottom of the trench and the implant of the channel under the third embodiment of the invention. It is to be noted that the depth of the penetration of the trench into the surface of the semiconductor substrate is significantly larger than the penetration created under the first and second embodiment of the invention.

DETAILED DESCRIPTION OF THE PREFERRED EMBODIMENT

Figure 1:
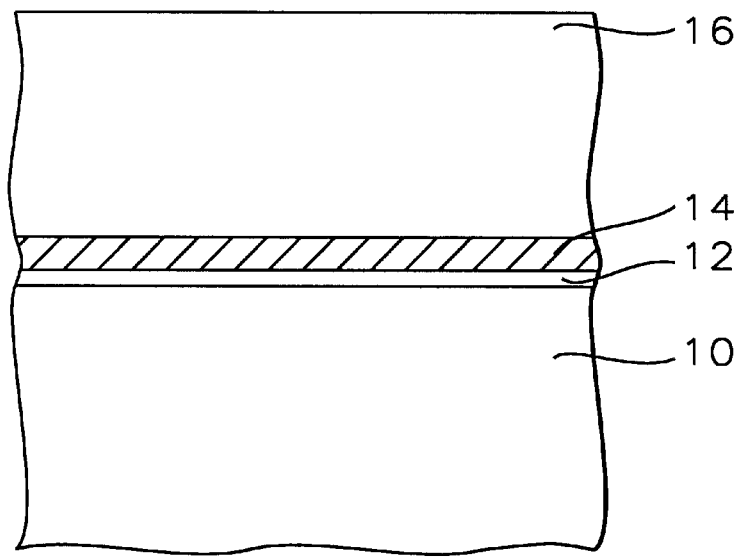
FIG. 1 shows a cross-section of the silicon substrate after the deposition of the thin dielectric layer and the deposition of the heavy layer of oxide for the first, second and third embodiment of the invention.

Referring now specifically to FIG. 1, there is shown a cross section of the silicon substrate 10, a thin layer 12 of oxide formed on top of substrate 10 over which a layer 14 of silicon nitride is deposited. The two layers 12 and 14 together form a dielectric. A thick layer 16 of oxide is deposited on top of this dielectric layer.

For the deposition of the thin layer 12 of oxide, Low Pressure CVD is the preferred deposition technology because of the high deposition rates and the excellent film thickness uniformity.

The thin layer 12 of oxide is typically deposited to a thickness of between 20 and 500 Angstrom. The method of deposition is furnace oxide deposition or CVD oxide deposition. Layer 12 serves as a stress release between the silicon substrate (10) and layer 14 of silicon nitride.

Layer 14 is an etch stop layer, it is typically deposited to a thickness of between 50 and 500 Angstrom, used for layer 14 can be SiN or $SiO_xN_y$. This layer can be deposited using a thermal or CVD deposition process.

Layer 16 is a thick layer of oxide, it is typically deposited to a thickness of between 200 and 3000 Angstrom. It is deposited by either CVD or SOG techniques.

Figure 2:
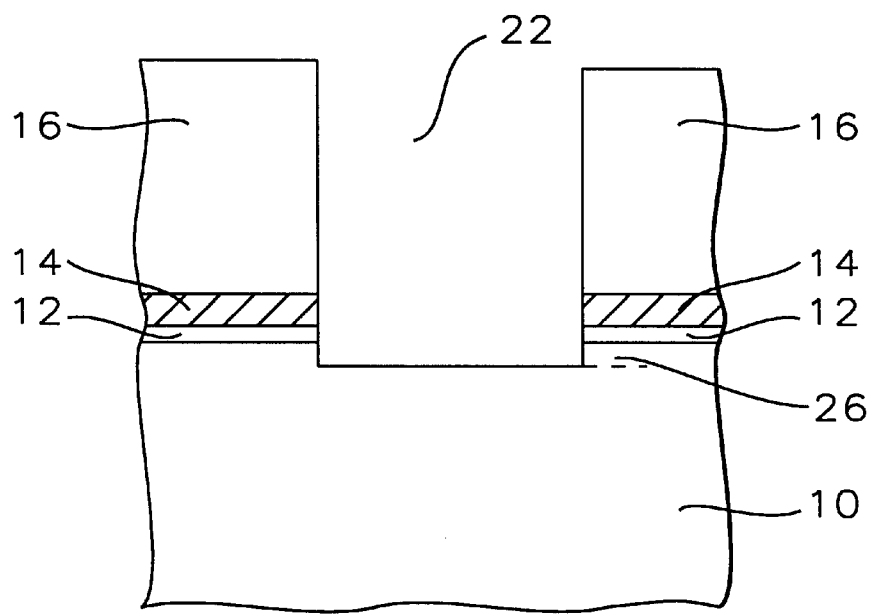
FIG. 2 shows a cross-section after formation of a trench under the first, second and third embodiment of the invention.

FIG. 2 shows a cross section after the trench 22 patterning and etching has been completed. The trench is patterned and etched using a widened poly pattern, that is a pattern wide enough that electrode spacers and the gate electrode can be accommodated in the trench. The wider gate makes the silicidation easier since silicidation typically exhibits the line-width effect, that is increased junction leakage caused by the silicide in the source/drain regions while, to form a silicide, a substantial portion of the Si from the junction is consumed. This line-width effect becomes more of a problem as the line width of the device shrinks. The etch is an etch through the thick layer 16, through dielectric 24 and into the substrate 10. The etch forms a small, shallow trench 26 in the substrate 10.

The width of trench 22 is typically in excess of 0.15 um and is determined by the width of the gate electrode.

Typical separation between the source and the drain region of the gate electrode is 0.2 um. This separation follows from a typical physical gate length of 0.10 um and a spacer width of 0.05 um.

The shallow trench 26 is typically between 100 and 1500 Angstrom deep.

Figure 3:
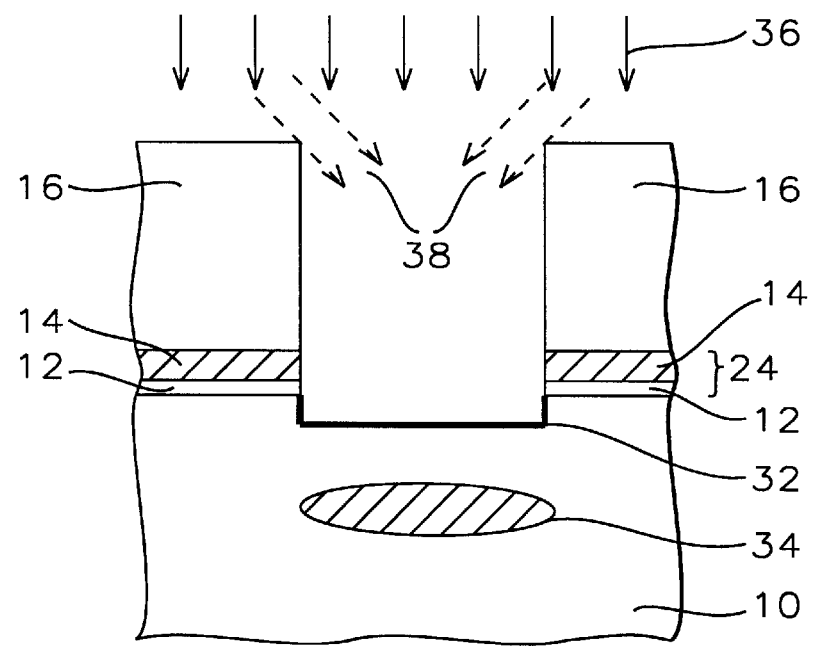
FIG. 3 shows a cross-section after formation of the oxide on the bottom of the trench and during the channel implant, LDD and pocket implant under the first embodiment of the invention.
Figure 4:
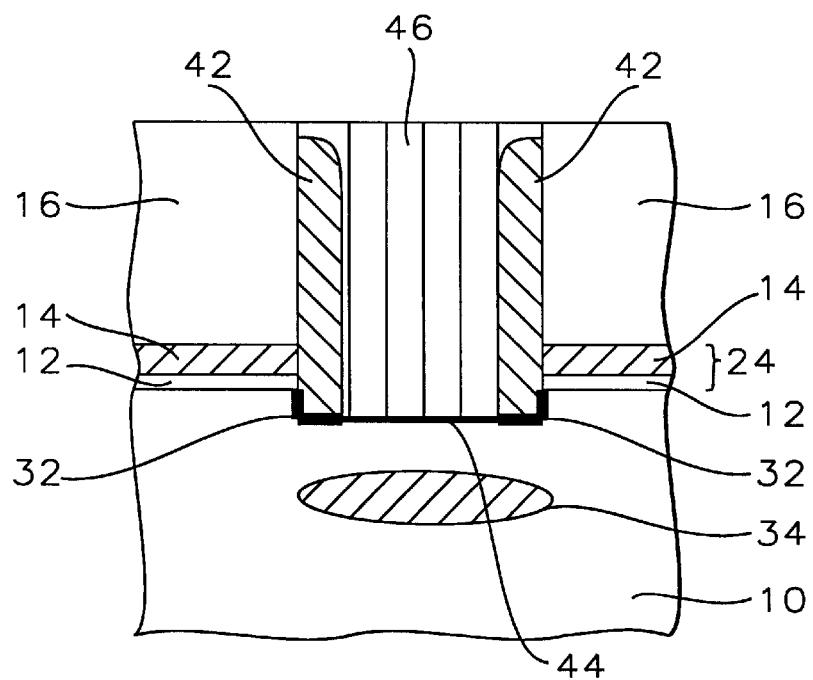
FIG. 4 shows a cross-section after the spacer, gate dielectric and gate electrode have been formed under the first embodiment of the invention.
Figure 5:
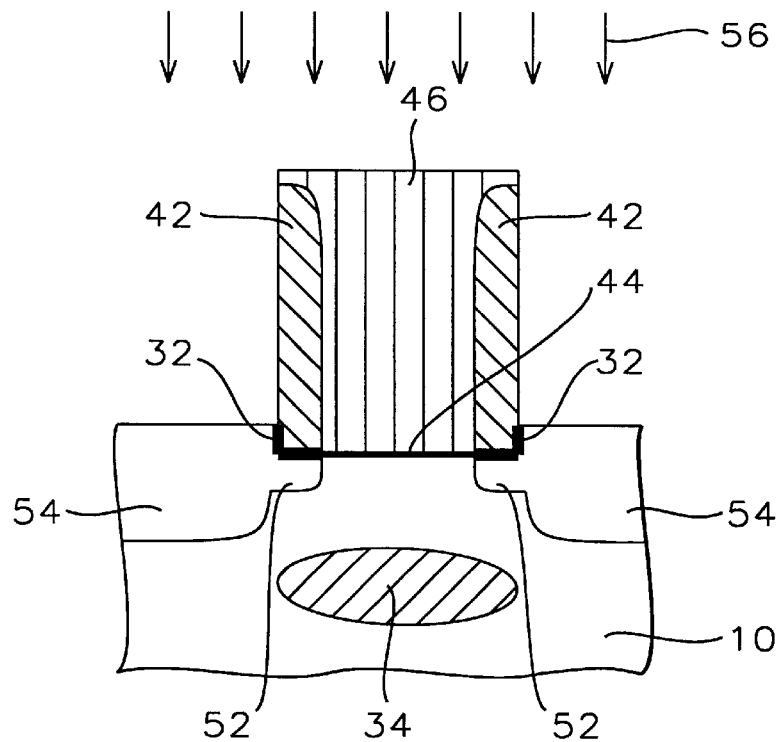
FIG. 5 shows a cross-section after the heavy layer of oxide and the dielectric layer have been removed and during the source/drain regions implant under the first embodiment of the invention.

FIGS. 3, 4 and 5 show the first embodiment of the present invention.

FIG. 3 shows a cross section after the formation of a thin oxide layer at the bottom of the shallow trench 26. The channel implant 36 has been completed creating the channel stop area 34 under the thin oxide layer 32. Also completed is the LDD 38 and the pocket implant. It is to be noted that the LDD implant 38 is performed under an angle, this angle of the implant provides an implant "shadow" whereby the LDD implant and ionization 38 will affect only the extreme corners under the shallow trench 26.

During the LDD implant, layer 16 (FIG. 3) shadows the implant 38. As a consequence, only the areas under the corners of the bottom of the trench 26 (areas 52, FIG. 4) will accept the LDD implant 38.

Hot-carrier effects cause unacceptable performance degradation in CMOS devices that are built with conventional drain structures if their channel lengths are less than 2 um. To overcome this problem, Lightly Doped Drains (LDD) are used. The structures absorb some of the potential into the drain and thus reduce the maximum electric field $E_M$. In the LDD structure, the drain is formed by two implants. One of these is self-aligned to the gate electrode, and the other is self-aligned to the gate electrode on which two oxide sidewall spacers will be formed. The purpose of the lighter dose is to form a lightly doped section of the drain at the edge near the channel. The $E_M$ is reduced by this structure because the voltage drop is shared by the drain and the channel, this in contrast with a conventional drain structure in which almost all of the voltage drop occurs across the lightly doped channel region.

Channel implant typically uses arsenic (As), antimony (Sb), boron, borofluoride ($BF_2$), indium (In), phosphorus (P).

Typical implant conditions are as follows:

| P-well implant: | | |
|---|---|---|
| boron | energy: | 100 to 220 keV |
|  | dose: | 1e13 to 1e14 atoms/cm² |
| boron | energy: | 5 to 40 keV |
|  | dose: | 1e12 to 5e13 atoms/cm² |
| indium | energy: | 50 to 250 keV |
|  | dose: | 1e12 to 1e14 atoms/cm² |
| N-well implant: | | |
| P | energy: | 300 to 600 keV |
|  | dose: | 1e13 to 5e14 atoms/cm² |
| P | energy: | 50 to 300 keV |
|  | dose: | 1e12 to 5e13 atoms/cm² |
| As | energy: | 50 to 200 keV |
|  | dose: | 1e12 to 1e14 atoms/cm² |

The channel implant typically penetrates between 0.02 and 1.5 um.

The LDD is typically performed as follows:

| For NMOS: | | |
|---|---|---|
| As | energy | 1 to 10 keV |
|  | dose | 1e14 to 1e16 atoms/cm² |
| For PMOS: | | |
| $BF_2$ | energy | 1 to 10 keV |
|  | dose | 1e14 to 5e15 atoms/cm² |

The indicated pocket implant establishes a high punch through voltage that results in a low off-state current. Typical operating conditions for the pocket implant are as follows:

| For NMOS: | | |
|---|---|---|
| In | energy | 50 to 250 keV |
|  | dose | 5e12 to 1e14 atoms/cm² |
| For PMOS: | | |
| As | energy | 50 to 250 keV |
|  | dose | 5e12 to 1e14 atoms/cm² |

FIG. 4 shows the formation of the spacer 42, the removal of the oxide from the bottom of the trench, the formation of the gate dielectric 44 and the gate electrode 46.

Typical operating conditions for these three steps are as follows:

Spacer 42 can be formed using thermal $S_iN$ or by CVD $S_iN$ or by thermal $SiO_xN_y$ or by CVD $SiO_xN_y$.

Gate dielectric 44 can be formed RTO oxide or by JVD oxide or by RTP $S_iN$ or by RTP $SiO_xN_y$ or by JVD $T_iO_2$ or by JVD $TaO_2$.

Gate electrode 46 can be formed by CVD and/or poly Si or SiGe.

Spacer 42 typically is between 250 and 1,500 Angstroms thick wherein forming the gate spacer comprises thermally growing of a thin layer of oxide on the sidewalls of the trench pattern using a short dry-oxidation process whereupon a conformal CVD oxide film is deposited by decomposing TEOS at between 700 and 750 degrees C. followed by an anisotropic dry etch, thereby leaving the spacers on the sidewalls of the trench pattern.

It is to be noted that the thin layer of oxide at the bottom of the trench is removed only after the spacer has been formed resulting in the remaining presence of this oxide in the extreme corners 32 and under spacer 42. The gate dielectric 44 is formed after the spacer has been formed and is therefore present on the bottom of the trench and between the spacer.

The spacers have been etched with a slight overetch, the spacer height is therefore slightly less than the height of the poly. For poly gate a thickness of 2000 Angstrom and a deposited oxide film thickness of approximately 2200 Angstrom, spacer width of 1000 Angstrom are typically obtained.

FIG. 5 shows the final structure of the gate electrode within the first embodiment of the present invention. The thick oxide layer 16 (FIG. 4) is etched away. This etch is patterned with a wet or diluted HF, BOE RIE process designed to produce a poly feature with vertical sidewalls. The dielectric layer 24 is also etched away. The thin dielectric layer 24 (FIG. 4) is also removed.

The n⁻ implant 52 is the LDD that is formed by the implantation 38 (FIG. 3). This implant, also called the graded drain or tip implant, can be carried out with phosphorous to form the lightly doped region of the S/D regions.

The source/drain implant 56 is performed as follows, this implant forms the S/D regions 54.

Conditions for implant 56 are as follows:

| For n⁺/p⁺ NMOS: | | |
|---|---|---|
| As | energy: | 15 to 100 keV |
|  | dose: | 1e14 to 5e16 atoms/cm² |
| P | energy: | 10 to 100 keV |
|  | dose: | 1e16 to 5e16 atoms/cm² |

Conditions for the doping are as follows:

| For PMOS: | | |
|---|---|---|
| B | energy: | 1 to 50 keV |
|  | dose: | 1e13 to 1e16 atoms/cm² |
| $BF_2$ | energy: | 5 to 180 keV |
|  | dose: | 1e13 to 1e16 atoms/cm² |

The n⁻ region at this time is essentially self-aligned to the gate electrode. After the n⁻ implant, a high dose n⁺ implant is performed with a high current implanter. Typically, arsenic is implanted at a dose of about $5 \times 10^{15}$ cm⁻² and at energies of 40–80 keV. This forms the low-resistivity drain region 54, which is merged with a lightly doped n⁻ region. Because the spacer serves as a mask for the As implant, the heavily doped n⁻ region is self-aligned to the sidewall spacer edges and is thus offset from the gate edge. Since the edge of the n⁺ regions is further away from the channel than would have been the case in the conventional drain structure, the depth of the heavily doped region of the drain can be made somewhat greater without adversely affecting the device operation. The increased junction depth lowers both the sheet resistance and the contact resistance of the drain.

At this point in the processing sequence the gate electrode structure within the first embodiment of the present invention is complete. Created has been a device with an elevated source/drain structure and a gate with a self-aligned channel implant. The elevate source/drain structure prevents the consumption of silicon during silicidation and is therefore a major advantage of the structure of the present invention.

FIGS. 6, 7, 8 and 9 show the second embodiment of the present invention. The processing steps as detailed under FIGS. 1 and 2 apply also the second embodiment of the present invention, it is assumed that the explanations previously provided for FIG. 1 and FIG. 2 precede the following explanations.

Figure 6:
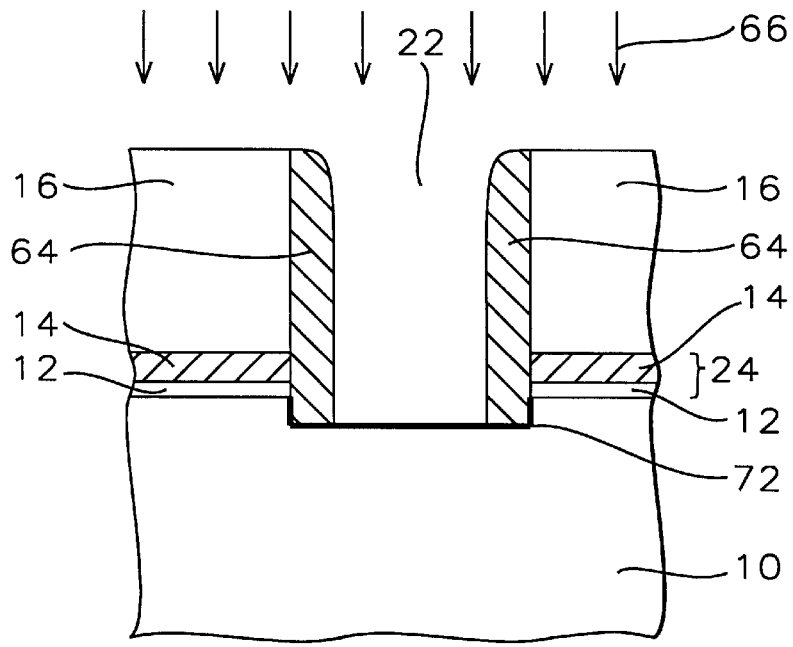
FIGS. 6 through 9 show the second embodiment of the invention.

Referring now specifically to FIG. 6, there is shown a cross section of the trench 22 for the gate electrode, the formation of a thin layer 72 of oxide at the bottom of the trench 22 that has been etched into the silicon substrate 10, the completion of (deposition and etch) the spacer 64 and the implant 66 of channel stop.

Figure 7:
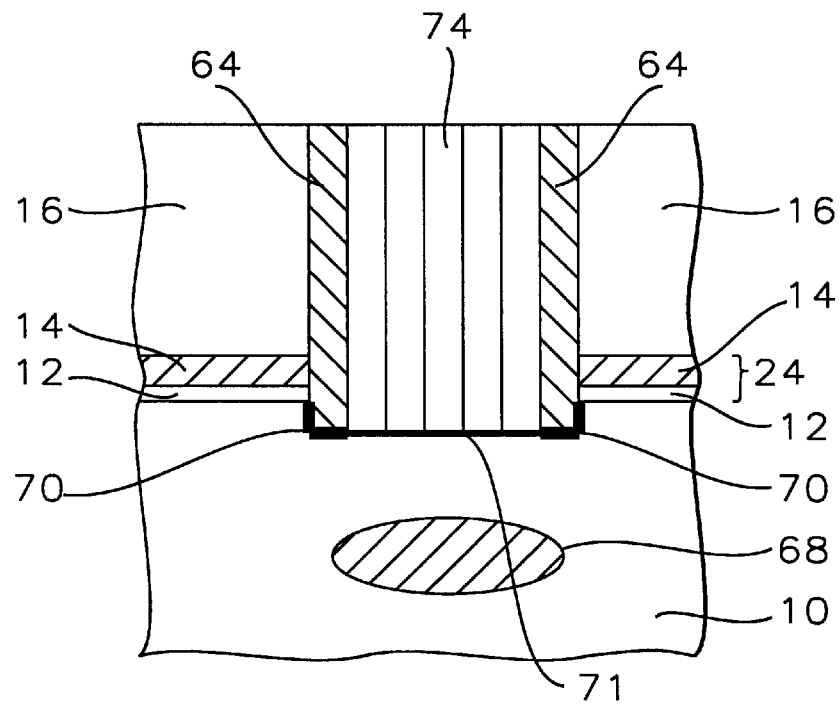

Referring now to FIG. 7, there is shown a cross section of the formation of the gate dielectric 71 and the creation (deposition and etch/planarization) of gate electrode 71. The layer of oxide 72 (FIG. 6) has, prior to the formation of the gate electrode, removed from the bottom of the trench between the spacer, the gate dielectric 71 has been formed between the spacer and overlying the bottom of the trench. Corners 70 of the trench retain the (original) oxide deposition.

The gate dielectric is formed by thermal oxide or RTO oxide or Thermal SiN or thermal $SiO_xN_y$ or by RTP SiN or by RTP $SiO_xN_y$ or by JVC oxide, SiN, $TiO_2$ or $TaO_2$.

Figure 8:
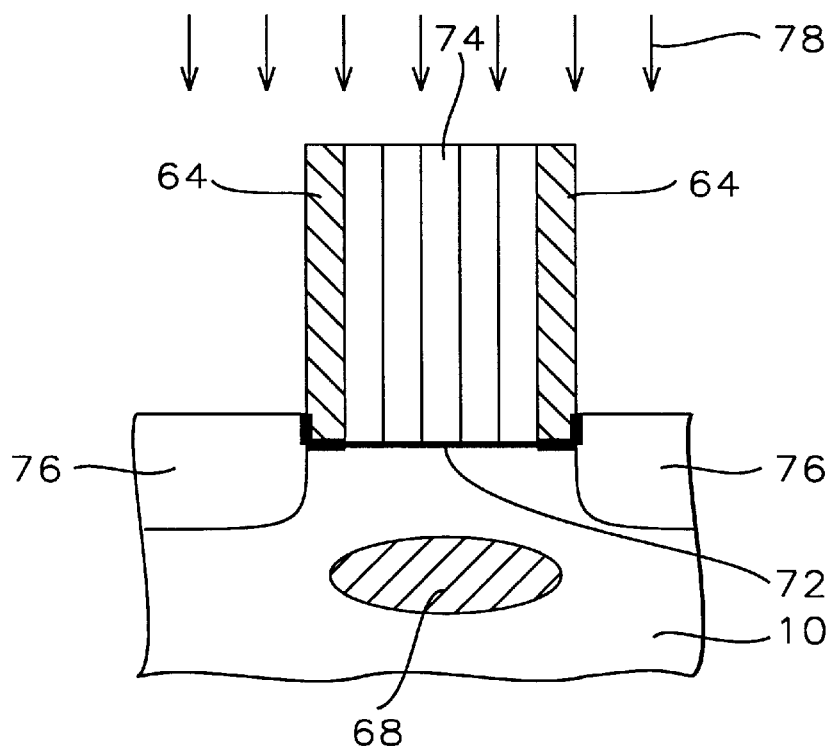

Referring now to FIG. 8, there is shown a cross section of gate electrode after the layer of thick oxide 16 (FIG. 7) has been removed, dielectric 24 (FIG. 7) has also been removed. S/D 78 has implanted the source/drain regions 76.

Figure 9:
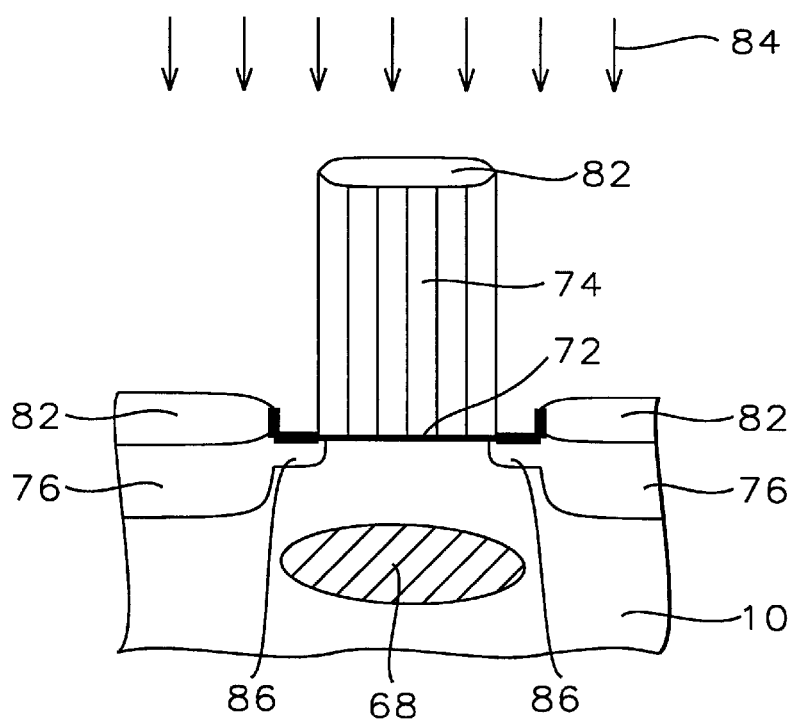

FIG. 9 shows a cross section of the gate electrode after the formation of silicide 82, the removal of spacers 64 (FIG. 8) and the implant 84 of the lightly doped areas 86. It must be emphasized that the second embodiment of the invention results in having disposable spacer, an approach that greatly facilitates the LDD implant as will be clear from FIG. 9.

FIG. 9 shows the cross section of the completed gate electrode within the scope of the second embodiment of the present invention. The second embodiment also results in a device with elevated source/drain regions while the channel implant has been achieved by means of a self-aligned channel implant. The advantages of the construct of the first embodiment as previously highlighted equally apply to the second embodiment of the present invention.

Processing conditions for the steps of channel implant, the formation of LDD areas and spacer and the formation of the gate dielectric are, under the second embodiment of the invention, essentially the same as the conditions indicated for these processing steps under the first embodiment of the invention.

Figure 10:
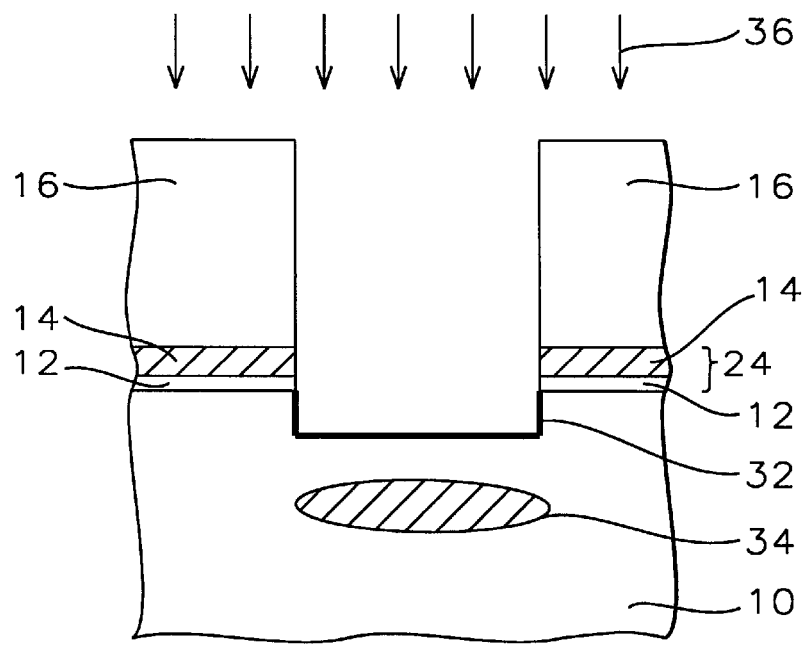

FIG. 10 shows the third embodiment of the present invention. The processing steps as detailed under FIGS. 1 and 2 apply also the third embodiment of the present invention, it is assumed that the explanations previously provided for FIG. 1 and FIG. 2 precede the following explanations.

Processing conditions for the third embodiment will not be further detailed in the following while it will be assumed that these conditions are identical to the processing conditions as highlighted for a given process under the first two embodiments of the invention.

Referring now specifically to FIG. 10, there is shown a cross section of the gate trench with a thin oxide layer 32 on the bottom of this trench. The channel implant 36 has been completed creating the channel stop area 34 under the thin oxide layer 32.

While the present invention has been described with reference to illustrative embodiments, this description is not to be construed in a limiting sense. Various modifications and combinations, as well as other embodiments of the invention reference to the description. It is therefore intended that the appended claims encompass any such modifications or embodiments.

What is claimed is:

1. A method of forming a semiconductor for use with a gate electrode damascene process, comprising:

providing a semiconductor silicon substrate;

forming a thin dielectric layer on top of said substrate;

depositing a thick layer of oxide on top of said thin dielectric layer;

creating a trench pattern, said trench pattern to penetrate and go through said thick layer of oxide furthermore to penetrate and go through said thin dielectric layer furthermore to penetrate the surface of said silicon substrate to form a shallow trench pattern in said substrate;

forming a thin layer of oxide at the bottom of said trench pattern;

forming spacers on sidewalls of said trench pattern;

performing a channel implant in said silicon substrate, said channel implant being self-aligned with said trench pattern, said channel implant penetrating the surface of said substrate to a depth within a range of between 0.02 and 1.5 $\mu$m;

removing said thin layer of oxide from the bottom of said trench pattern where said thin layer of oxide is not covered by said spacers;

forming a gate dielectric at the bottom of said trench pattern and on said gate dielectric where said thin layer of oxide has been removed;

forming a gate electrode in said trench pattern;

removing said thick layer of oxide from the top of said thin dielectric layer;

removing said thin dielectric layer from the top of said substrate;

performing source and drain implant in the surface of said silicon substrate said implant to be substantially self-aligned with said spacers;

forming salicide on the surface of said silicon substrate above said source and drain implants and on the top surface of said gate electrode;

removing said spacers from sidewalls of said trench pattern; and forming Lightly Doped Drain areas in said silicon substrate, said LDD areas being self-aligned with extreme corners of said bottom of said trench pattern by an angle implantation.

2. The method of claim 1 wherein said thin dielectric layer contains a thin layer of oxide, said thin layer of oxide having a thickness within a range of between 20 and 500 Angstroms over which is deposited a layer of silicon nitride, said layer of silicon nitride having a thickness within a range of between 50 and 500 Angstroms, said thin layer of oxide being a CVD oxide, whereby said thin oxide serves as a stress release between said silicon substrate and said layer of silicon nitride, said layer of silicon nitride being deposited using a CVD process, said layer of silicon nitride serving as an etch stop layer.

3. The method of claim 1 wherein said thick layer of oxide is a layer with a thickness within a range between 200 and 300 Angstroms, said thick layer of oxide being deposited using CVD or SOG techniques.

4. The method of claim 1 wherein said creating a trench pattern comprises an RIE etch process designed to create said trench pattern having vertical sidewalls, whereby a width of said trench pattern equals a width of a to be created gate electrode increased by two times a spacer width, thereby allowing creation of a spacer surrounding said gate electrode, whereby furthermore said trench pattern is etched through said thick oxide layer further etched through said dielectric layer and further etched into the surface of said substrate, thereby forming a shallow trench in the surface of said substrate.

5. The method of claim 1 wherein said creating a trench pattern is creating said shallow trench to be wide in excess of 0.15 $\mu$m, said shallow trench having a depth in the silicon substrate within a range of between 100 and 1500 Angstroms.

6. The method of claim 1 wherein the Lightly Doped Drain areas are formed by implantation.

7. The method of claim 1 wherein said thin layer of oxide is created at the bottom of said shallow trench thereby creating a surface where the gate dielectric will be formed.

8. The method of claim 1 whereby said forming spacers comprises thermally growing of said thin oxide on sides of said trench pattern using a short dry-oxidation process whereupon a conformal CVD oxide film is deposited by decomposing TEOS at between 700 and 750 degrees C. followed by an anisotropic dry etch, thereby leaving said spacers on sidewalls of said trench pattern.

9. The method of claim 1 wherein said spacers are formed by a process including a substantially conformal deposition within said trench pattern of a spacer material selected from the group consisting of nitride, oxide, BSG, PSG and any combination thereof, and a subsequent, substantially anisotropic etch of said spacer material.

\* \* \* \* \*